(12) United States Patent
Chiou et al.

(10) Patent No.: US 6,500,767 B2
(45) Date of Patent: Dec. 31, 2002

(54) METHOD OF ETCHING SEMICONDUCTOR METALLIC LAYER

(75) Inventors: Jen-Jiann Chiou, Hsin-Ying (TW); Shin-Yi Tsai, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/874,164

(22) Filed: Jun. 5, 2001

(65) Prior Publication Data

US 2002/0137351 A1 Sep. 26, 2002

(30) Foreign Application Priority Data

Mar. 20, 2001 (TW) ........................................ 90106422 A

(51) Int. Cl.[7] .............................................. H01L 21/00
(52) U.S. Cl. ........................... 438/720; 216/41; 216/67; 216/75; 216/77; 438/734; 438/737; 438/742
(58) Field of Search ................................. 438/714, 720, 438/734, 737, 742; 216/41, 67, 75, 77

(56) References Cited

U.S. PATENT DOCUMENTS

| 5,883,007 | A |   | 3/1999  | Abraham et al. |
|-----------|---|---|---------|----------------|
| 5,952,244 | A |   | 9/1999  | Abraham et al. |
| 6,133,145 | A | * | 10/2000 | Chen ........................ 438/720 X |
| 6,242,358 | B1 | * | 6/2001  | Chu et al. ............... 438/720 X |
| 6,306,771 | B1 | * | 10/2001 | Syau et al. ............. 438/742 X |
| 6,383,942 | B1 | * | 5/2002  | Narita et al. ............ 438/742 X |

* cited by examiner

*Primary Examiner*—William A. Powell
(74) *Attorney, Agent, or Firm*—J. C. Patents

(57) ABSTRACT

A method of etching a metallic layer having an anti-reflection layer thereon. The method includes performing a first etching operation using a fixed set of processing parameters to etch the anti-reflection layer and remove a specified thickness of the metallic layer. Thereafter, a second etching operation is conducted to etch the remaining metallic layer.

19 Claims, 2 Drawing Sheets

METHOD OF ETCHING SEMICONDUCTOR METALLIC LAYER

CROSS-REFERENCE TO RELATED APPLICATION

This application claims the priority benefit of Taiwan application serial no. 90106422, filed Mar. 20, 2001.

BACKGROUND OF THE INVENTION

1. Field of Invention

The present invention relates to an etching process. More particularly, the present invention relates to a method of etching a semiconductor metallic layer.

2. Description of Related Art

Due to the rapid reduction of device dimensions in semiconductor circuits, alignment accuracy in photolithographic and etching processes is compromised. Misalignment causes serious problems, especially in the patterning of a metallic conductive layer. This is because a conductive layer has a high reflectivity index. Hence, a portion of the light from a light source is reflected back during photo-exposure, leading to a deviation in size of the developed photoresist pattern. Ultimately, an inaccurate pattern is transferred to the conductive layer. To prevent such patterning errors, an anti-reflection coating (ARC) is generally deposited over the conductive layer to reduce back reflection.

Most anti-reflection coating is made from an organic or an inorganic material. In general, organic anti-reflection coating such as a polymer layer is formed the conductive layer after the photoresist layer. Conversely, inorganic anti-reflection coating such as a titanium nitride layer is formed over the conductive layer before the photoresist layer.

A titanium nitride anti-reflection coating not only prevents the production of unwanted back reflection during photo-exposure, but also protects the conductive layer against attack by corrosive agents and the infiltration of impurities. Currently, a silicon oxynitride layer (SiON) is often used as a strengthening layer for the anti-reflection coating so that anti-reflection capacity is further enhanced.

FIG. 1 is a schematic cross-sectional view showing a semiconductor device after a conventional metallic layer etching operation. The etching operation is conducted to pattern the anti-reflection coating and the metallic layer. As shown in FIG. 1, a substrate 100 is provided. A titanium nitride barrier layer 102 is formed over the substrate 100 and a patterned metallic layer 104 is formed over the barrier layer 102 through a metallic layer etching operation. A patterned anti-reflection coating is also formed over the patterned metallic layer 104. However, defective recesses are often formed at the interface 108 between the metallic layer 104 and the anti-reflection coating 106. A reason for this is the difference in etching rate between the metallic layer 104 and the anti-reflection coating 106. When the metallic layer is etched, over-etching at the interface between the metallic layer 104 and the anti-reflection coating 106 occurs. Ultimately, recess cavities are formed in the corner region. Since convention method relies on the simultaneous removal of both the anti-reflection coating and the metallic layer in an etching operation, corner cutting at the metallic layer/anti-reflection coating interface is difficult to resolve.

SUMMARY OF THE INVENTION

Accordingly, one object of the present invention is to provide a method of etching a semiconductor metallic layer so that corner cutting at the interface of the metallic layer and the anti-reflection coating is reduced.

To achieve these and other advantages and in accordance with the purpose of the invention, as embodied and broadly described herein, the invention provides a method of etching a semiconductor metallic layer. An anti-reflection coating etching operation using specific processing parameters is carried out to remove the anti-reflection coating and a pre-determined thickness of the metallic layer. This is followed by a metallic layer etching operation.

The invention provides a method of etching a metallic layer on a semiconductor substrate, with an anti-reflection layer formed on the metallic layer. A first stage etching operation is performed to etch the anti-reflection layer and a specified thickness of the metallic layer, including processing parameters, such as a top electrode power of about 400–700W, a bottom electrode power of about 100–200W, a chlorine to boron trichloride ratio of about 0.6–1.5, a gaseous nitrogen flow rate less than 10 sccm, a trifluoromethane flow rate less than 20 sccm, an overall gaseous flow rate of about 50–200 sccm, an operating pressure of about 8–15 mTorr. A second stage etching operation is then performed to etch the remaining metallic layer.

It is to be understood that both the foregoing general description and the following detailed description are exemplary, and are intended to provide further explanation of the invention as claimed.

DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
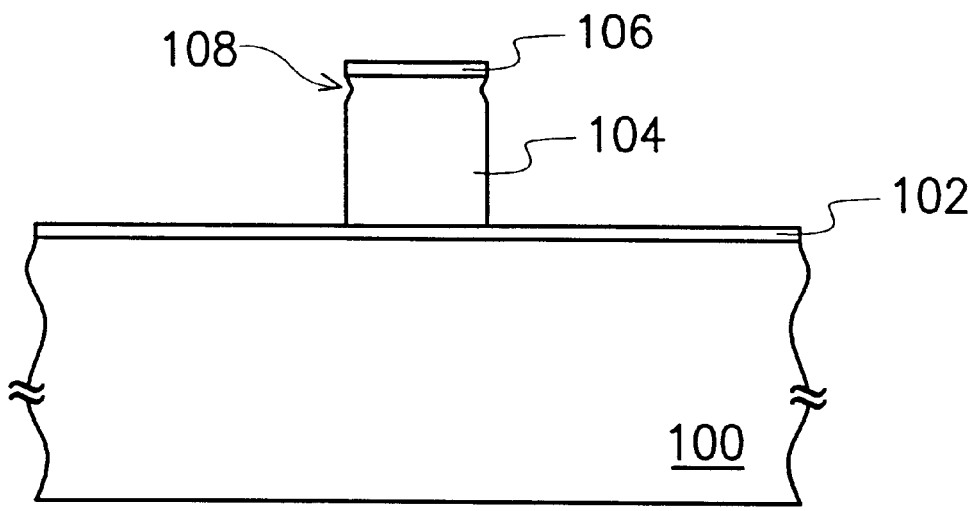
FIG. 1 is a schematic cross-sectional view showing a semiconductor device after a conventional metallic layer etching operation.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
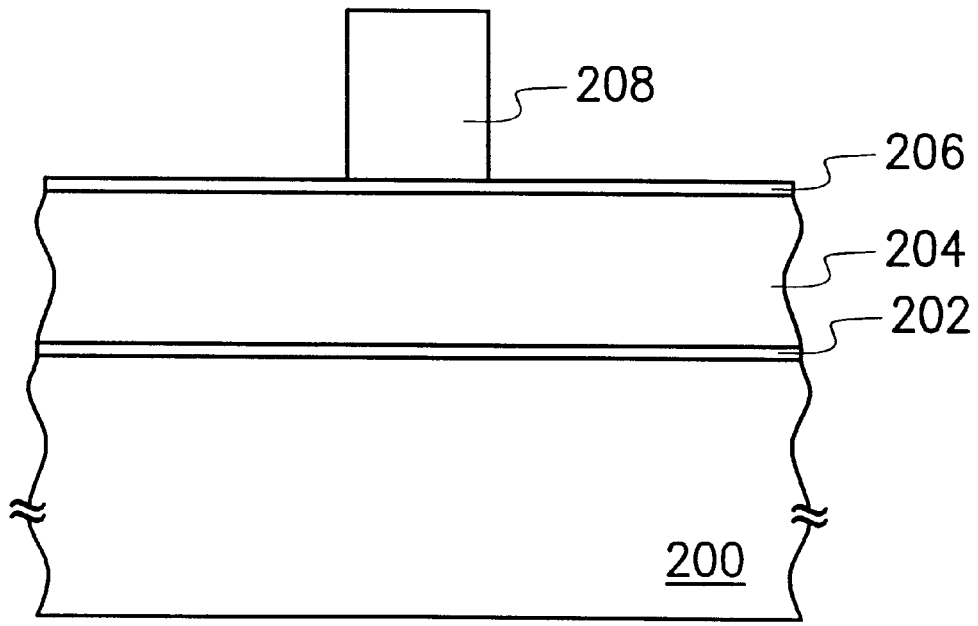
FIGS. 2A through 2D are schematic cross-sectional views showing the progression of steps for etching a metallic layer and an anti-reflection coating over a substrate according to one preferred embodiment of this invention.

FIGS. 2A through 2D are schematic cross-sectional views showing the progression of steps for etching a metallic layer and an anti-reflection coating over a substrate according to one preferred embodiment of this invention. As shown in FIG. 2A, a substrate 200 having a barrier layer 202 thereon is provided. The barrier layer 202 has a metallic layer 204 thereon and the metallic layer 204 has an anti-reflection coating 206 thereon. Furthermore, the anti-reflection coating 206 has a patterned mask layer 208 thereon. The substrate 200 can be a contact plug, a via plug or a dual damascene structure, for example. The barrier layer 202 can be a titanium nitride (TiN) layer, the metallic layer 204 can be an aluminum-copper (Al—Cu) layer, the anti-reflection coating 206 can be a titanium nitride (TiN) layer and the mask layer 208 can be a photoresist layer, for example.

Figure 2B:
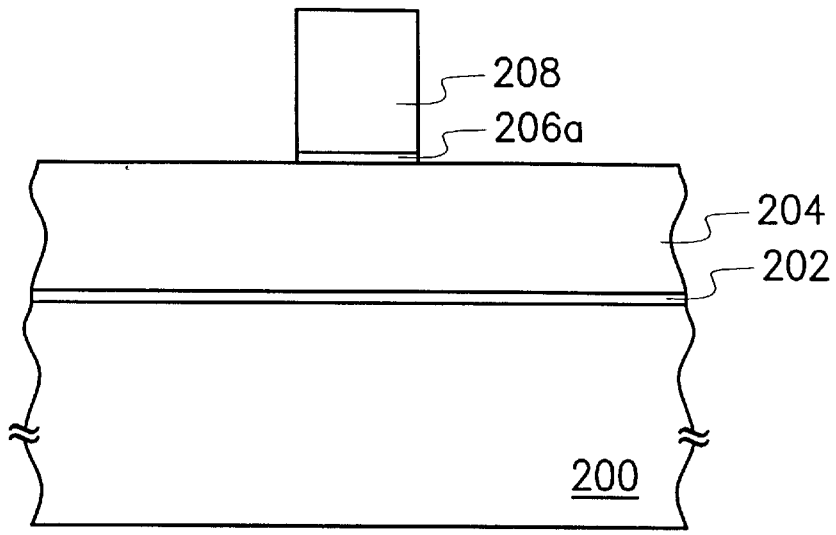

As shown in FIG. 2B, the anti-reflection coating 206 is etched by conducting an anti-reflection coating etching operation using a set of specific processing parameters to form a patterned anti-reflection layer 206a. The set of parameters used in the anti-reflection coating etching operation includes a source of power of about 400W–700W, a gaseous mixture of chlorine and boron trichloride at a ratio ($Cl_2/BCl_3$) of about 0.6–1.5, a gaseous nitrogen flow rate less than about 10 sccm (standard cubic centimeter per minute), a gaseous trifluoromethane ($CHF_3$) flow rate less than about 20 sccm, an overall gas flow rate of about 50–200 sccm and an operating pressure of about 8–15 mTorr. In addition, a wafer back pressure of about 6–10 Torr of helium (He) is also supplied.

Figure 2C:
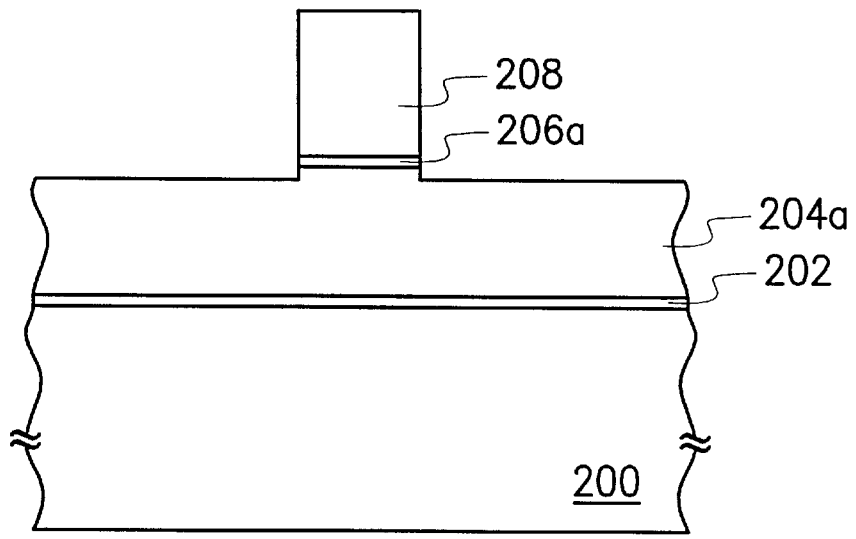

As shown in FIG. 2C, the anti-reflection layer etching is continued so that a portion of the metallic layer 204 underneath the anti-reflection layer 206a is removed to form a partially patterned metallic layer 204a. A total thickness of about 200 Å is removed from the metallic layer 204 in the etching operation.

Figure 2D:
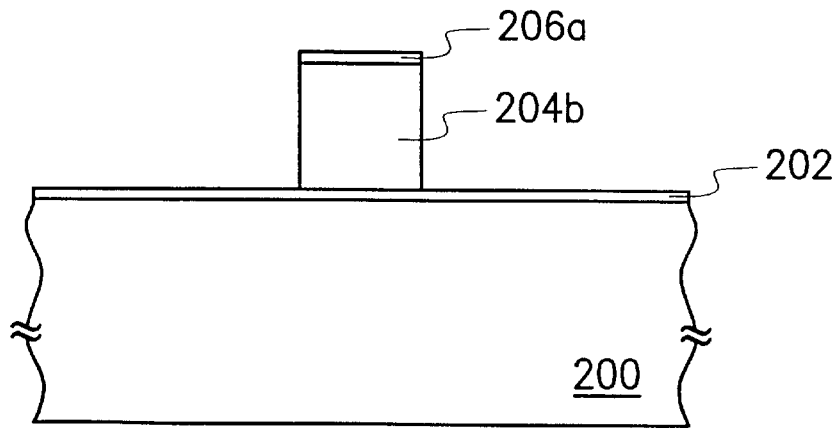

As shown in FIG. 2D, a conventional metallic layer etching operation is conducted to remove a portion of the partially patterned metallic layer 204a so that a patterned metallic layer 204b is formed. The metallic layer etching operation is carried out using a set of processing parameters including a top electrode source power of about 400W–800W, a bottom electrode power of about 100W–200W, a gaseous nitrogen flow rate of about 5–15 sccm, a gaseous boron trichloride flow rate of about 10–50 sccm, a gaseous chlorine flow rate of about 50–120 sccm, an operating pressure of about 8–12 mTorr. In addition, a wafer back pressure of 6–10 Torr of helium is also applied. After performing the aforementioned steps, defective corners are no longer formed at the interface between the metallic layer 204b and the anti-reflection layer 206a. Finally, the mask layer 208 is also removed.

In conclusion, major aspects of this invention include:

1. An anti-reflection layer etching operation using a set of specific processing parameters is used. Hence, defective recesses no longer form at the interface between the metallic layer and the anti-reflection layer due to a difference in etching rate between metallic and anti-reflection material.

2. After the anti-reflection layer etching is performed for sometime to remove the anti-reflection layer, the anti-reflection layer etching is continued to remove a portion of the metallic layer. Etching of the anti-reflection layer is stopped before any cut corners are formed at the interface between the metallic layer and the anti-reflection layer. Thereafter, a conventional metallic layer etching operation is conducted. Ultimately, etching is precisely controlled with little time wasted in separating out the etching process into two stages.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of etching a metallic layer on a semiconductor substrate, comprising the steps:

providing a substrate having an aluminum-copper layer thereon with the aluminum-copper layer having a titanium nitride anti-reflection layer thereon;

performing a first stage etching operation to etch the titanium nitride anti-reflection layer and a specified thickness of the aluminum-copper layer, wherein processing parameters for carrying out the first stage etching operation include:

a top electrode power of about 400W–700W;

a bottom electrode power of about 100W–200W;

a chlorine to boron trichloride ratio of about 0.6–1.5;

a gaseous nitrogen flow rate less than 10 sccm;

a trifluoromethane flow rate less than 20 sccm;

an overall gaseous flow rate of about 50–200 sccm;

an operating pressure of about 8–15 mTorr; and performing a second stage etching operation to etch the remaining aluminum-copper layer.

2. The method of claim 1, wherein thickness of the aluminum-copper layer removed in the first stage etching operation is greater than about 200 Å.

3. The method of claim 1, wherein an additional processing parameter for the first stage etching operation includes setting a wafer back pressure of helium of about 6–10 Torr.

4. The method of claim 1, wherein the processing parameters for performing the second stage etching operation include:

a top electrode power of about 400W–800W;

a bottom electrode power of about 100W–200W;

a gaseous nitrogen flow rate of about 5–15 sccm;

a gaseous boron trichloride flow rate of about 10–50 sccm;

a gaseous chlorine flow rate of about 50–120 sccm; and an operating pressure of about 8–12 mTorr.

5. The method of claim 4, wherein an additional processing parameter for the second stage etching operation includes setting a wafer back pressure of helium of about 6–10 Torr.

6. A method of etching a metallic layer on a semiconductor substrate, wherein the semiconductor substrate has a metallic layer with an anti-reflection layer thereon, the method comprising:

performing a first stage etching operation to etch the anti-reflection layer and a specified thickness of the metallic layer, wherein processing parameters for carrying out the first stage etching operation include:

a chlorine to boron trichloride ratio of about 0.6–1.5;

an overall gaseous flow rate of about 50–200 sccm; and performing a second stage etching operation to etch the remaining metallic layer.

7. The method of claim 6, wherein additional processing parameters for carrying out the first stage etching operation include:

a top electrode power of about 400W–700W;

a bottom electrode power of about 100W–200W;

a gaseous nitrogen flow rate less than bout 10 sccm;

a trifluoromethane flow rate less than about 20 sccm;

an operating pressure of about 8–15 mTorr;

a wafer back pressure of about 6–10 Torr.

8. The method of claim 6, wherein thickness of the metallic layer removed in the first stage etching operation is greater than about 200 Å.

9. The method of claim 6, wherein the metallic layer includes an aluminum-copper layer.

10. The method of claim 6, wherein the anti-reflection layer includes a titanium nitride layer.

11. The method of claim 6, wherein the processing parameters for performing the second stage etching operation include:

a top electrode power of about 400W–800W;

a bottom electrode power of about 100W–200W;

a gaseous nitrogen flow rate of about 5–15 sccm;

a gaseous boron trichloride flow rate of about 10–50 sccm;

a gaseous chlorine flow rate of about 50–120 sccm;

an operating pressure of about 8–12 mTorr; and a wafer back pressure of about 6–10 Torr.

12. A method of etching a metallic layer over a semiconductor substrate, wherein the substrate has a metallic layer with an anti-reflection layer thereon, the method comprising:

performing a first stage etching operation using a set of fixed processing parameters to etch the anti-reflection layer and remove a specified thickness of the metallic layer; and performing a second stage etching operation to etch the remaining portion of the metallic layer.

13. The method of claim 12, wherein thickness of the metallic layer removed in the first stage etching operation is greater than about 200 Å.

14. The method of claim 12, wherein the fixed processing parameters for carrying out the first stage etching operation include:

a top electrode power of about 400W–700W;

a bottom electrode power of about 100W–200W;

a chlorine to boron trichloride ratio of about 0.6–1.5;

a gaseous nitrogen flow rate less than about 10 sccm;

a trifluoromethane flow rate less than about 20 sccm;

an overall gas flow rate of about 50–200 sccm; and an operating pressure of about 8–15 mTorr.

15. The method of claim 14, wherein an additional processing parameter for the first stage etching operation includes setting a wafer back pressure of helium of about 6–10 Torr.

16. The method of claim 12, wherein the anti-reflection layer includes a titanium nitride layer.

17. The method of claim 12, wherein the metallic layer includes an aluminum-copper layer.

18. The method of claim 12, wherein the processing parameters for performing the second stage etching operation include:

a top electrode power of about 400W–800W;

a bottom electrode power of about 100W–200W;

a gaseous nitrogen flow rate of about 5–15 sccm;

a gaseous boron trichloride flow rate of about 10–50 sccm;

a gaseous chlorine flow rate of about 50–120 sccm; and an operating pressure of about 8–12 mTorr.

19. The method of claim 18, wherein an additional processing parameter for the second stage etching operation includes setting a wafer back pressure of helium of about 6–10 Torr.

* * * * *